United States Patent [19]

Plummer et al.

[11] Patent Number: 4,825,269

[45] Date of Patent: Apr. 25, 1989

[54] DOUBLE HETEROJUNCTION INVERSION BASE TRANSISTOR

[75] Inventors: James D. Plummer, Portola Valley; Robert C. Taft, Stanford, both of Calif.

[73] Assignee: Stanford University, Stanford, Calif.

[21] Appl. No.: 164,260

[22] Filed: Mar. 4, 1988

[51] Int. Cl.$^4$ ............................................. H01L 29/72
[52] U.S. Cl. ........................................ 357/34; 357/16; 357/4; 357/88
[58] Field of Search ........................... 357/34, 4, 16, 88

[56] References Cited

U.S. PATENT DOCUMENTS

| | | | |
|---|---|---|---|
| 4,180,825 | 12/1985 | Mann | 357/16 X |
| 4,561,916 | 12/1985 | Akiyama | 357/16 X |
| 4,593,305 | 6/1986 | Kurota | 357/16 X |
| 4,617,724 | 10/1986 | Yokoyama | 357/61 X |
| 4,712,121 | 12/1987 | Yokoyama | 357/34 |
| 4,771,326 | 9/1988 | Curran | 357/4 X |

Primary Examiner—Martin H. Edlow
Attorney, Agent, or Firm—Flehr, Hohbach, Test, Albritton & Herbert

[57] ABSTRACT

A bipolar transistor in which the base region includes a heterostructure and a doped layer of semiconductor material with the heterostructure functioning as a two-dimensional hole gas. The doped layer is sufficiently thin to prevent occurrence of a charge-neutral region of holes. In operation the transistor can switch quickly since minority charge storage in the base region does not present a problem. The device lends itself to downscaling in size in a VLSI circuit.

11 Claims, 2 Drawing Sheets

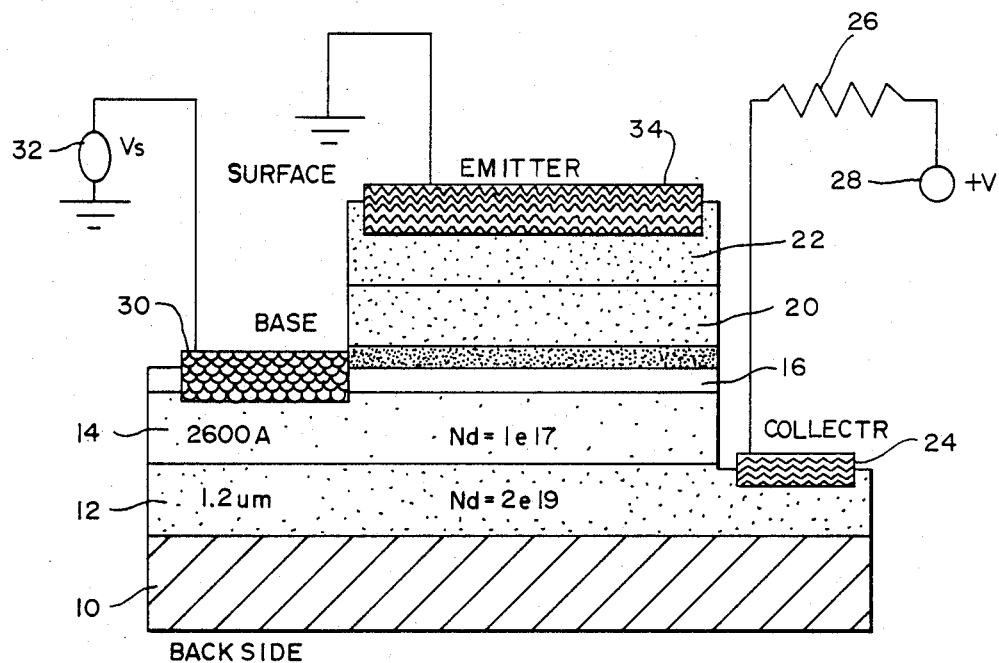
FIG.—2
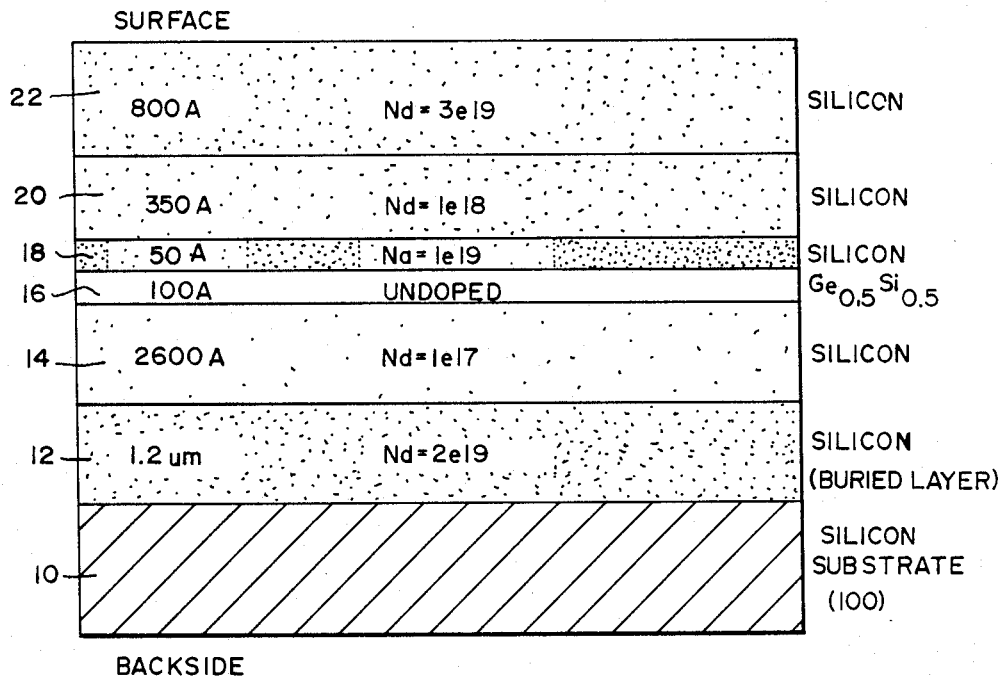
FIG.—1

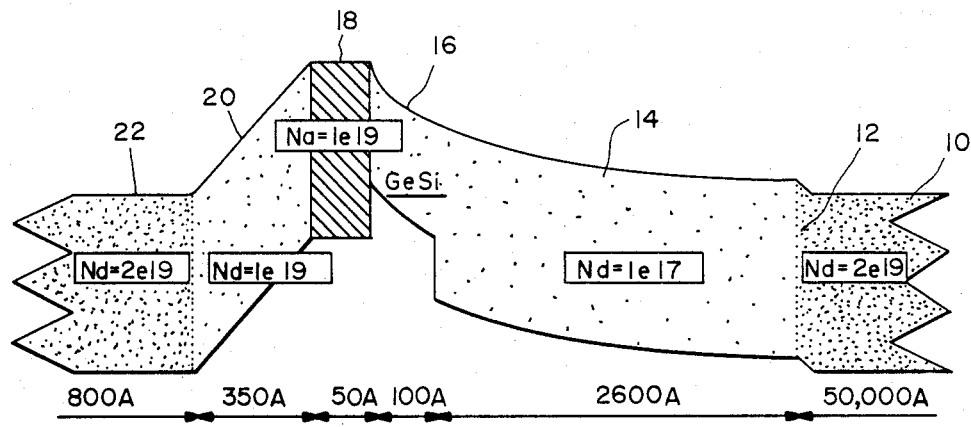
FIG.—3
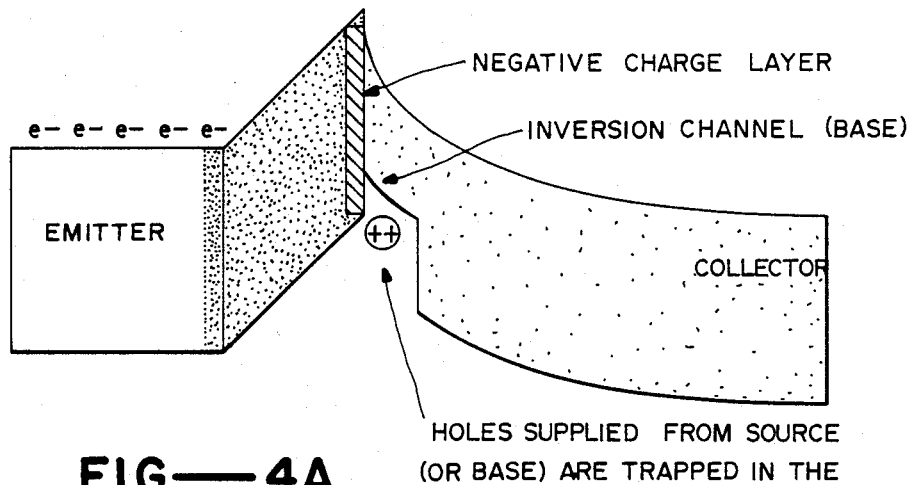
FIG.—4A
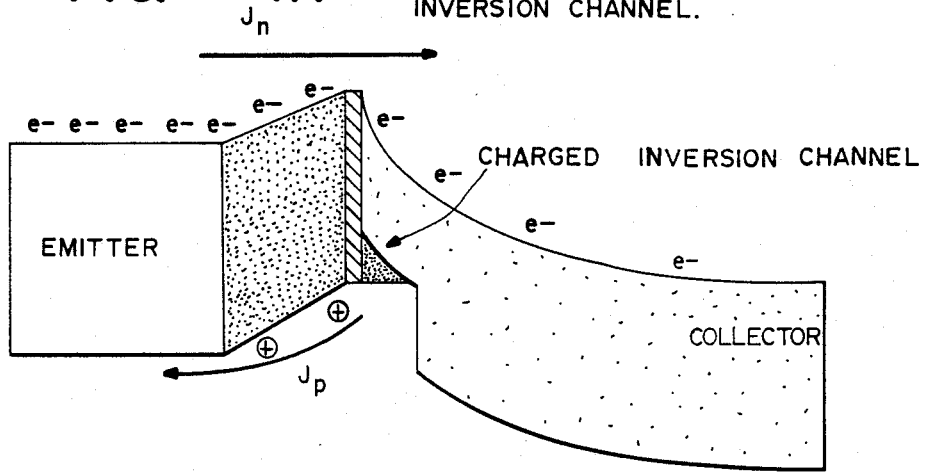
FIG.—4B

DOUBLE HETEROJUNCTION INVERSION BASE TRANSISTOR

BACKGROUND OF THE INVENTION

This invention relates generally to transistor structures, and more particularly the invention relates to a bipolar transistor having a double heterojunction inversion barrier.

Improved speed and transconductance in transistor devices have been achieved by reducing the physical size of the device structures by lithography, processing technology and structural design. However, the decrease in transistor size leads to problems in both junction and MOS transistors, the most serious problem being the punchthrough effect where the collector merges with the emitter of a bipolar transistor or where the drain and source depletion regions begin to merge in MOS transistors.

A new device structure has been proposed by Taylor and Simmons in "The Bipolar Inversion Channel Field Effect Transistor (BICFET)—A New Field Effect Solid State Device: Theory and Structures," *IEEE Transactions on Electronic Devices* November 1985. This device is bipolar in nature and relies upon the field effect inducement on an inversion layer that corresponds to the conventional neutral base of a bipolar transistor. The device utilizes a heterojunction, and does not have a base layer as in the conventional bipolar transistor. Yokoyama et al. U.S. Pat. No. 4,617,724 also discloses a heterojunction bipolar transistor.

SUMMARY OF THE INVENTION

An object of the present invention is an improved bipolar transistor device.

Another object of the invention is a bipolar transistor device having improved speed and reduced size.

A feature of the invention is a heterostructure in the base region of a bipolar transistor.

Briefly, a transistor device in accordance with the invention includes an emitter, a base, and collector. The base region includes a thin doped homogeneous semiconductor layer and an undoped heterostructure which functions as a two-dimensional hole gas. In a preferred embodiment, the structure comprises single crystalline silicon, with the heterostructure comprising a germanium-silicon alloy. Due to the need for abrupt doping profile (e.g. 50 Angstrom layers) and the use of a germanium-silicon alloy, molecular beam epitaxial processing is preferably employed in fabricating the device. Isolation between individual devices can be obtained by either selective epitaxy or mesa isolation.

The invention and objects and features thereof will be more readily apparent from the following detailed description and appended claims when taken with the drawing.

BRIEF DESCRIPTION OF THE DRAWING

FIG. 1 is a section view of a transistor layer structure in accordance with one embodiment of the invention.

FIG. 2 is a section view of a completed transistor structure including contacts using the layer structure of FIG. 1.

FIG. 3 illustrates a vertical cross-section of the band structure of the transistor of FIG. 2.

FIGS. 4a and 4b illustrate operation of the transistor of FIG. 2.

DETAILED DESCRIPTION OF ILLUSTRATIVE EMBODIMENT

Referring now to the drawing, FIG. 1 is a cross-sectional view illustrating the layers of a transistor structure in fabricating a bipolar transistor in accordance with one embodiment of the invention. The starting material is a silicon substrate 10 of (100) single-crystal material. Formed on a surface of the substrate 10 is a heavily-doped semiconductor layer 12 of approximately 1.2-micron thickness and with a dopant concentration of $2 \times 10^{19}$ atoms/cc of a donor such as antimony. Formed on the surface of the buried layer 12 is a layer 14 of silicon having a thickness of approximately 2600 Angstroms and a dopant concentration of $1 \times 10^{17}$ atoms/cc of a donor such as antimony. Layers 12 and 14 comprise the collector region of the transistor structure.

Formed on the surface of layer 14 is an undoped heterostructure 16 of a suitable material such as a germanium-silicon alloy having a thickness on the order of 100 Angstroms. Formed on the surface of the heterostructure 16 is a thin layer 18 (e.g. 50 Angstrom) of single-crystal silicon material having a dopant concentration of $1 \times 10^{19}$ atoms/cc of an acceptor such as boron. The layers 16 and 18 comprise the base region of the bipolar transistor with the region 18 contacting a two-dimensional hole gas provided by the heterostructure 16. The hole gas can be thought of classically as an inversion channel, and is confined by the valence band offset between silicon and germanium-silicon.

Formed on the surface of layer 18 is a layer 20 of silicon having a dopant concentration of $1 \times 10^{18}$ atoms/cc of a donor with the thickness of layer 20 being on the order of 350 Angstroms. Finally, formed on the surface of layer 20 is a layer 22 of an n-type silicon having a dopant concentration of $3 \times 10^{19}$ atoms/cc and a thickness on the order of 800 Angstroms. The layers 20 and 22 form the emitter of the finished transistor structure.

Due to the need for abrupt doping profiles and the use of the germanium-silicon layer, molecular beam epitaxy (MBE) is preferably employed in fabricating the layers. MBE is a well-known technique as described in U.S. Pat. No. 4,529,455, for example.

FIG. 2 is a section view of a completed transistor device using the structure of FIG. 1. The layers are suitably etched to form a mesa structure and provide isolation between a plurality of transistors formed on a single substrate. Since the structure is formed primarily of silicon, the sidewalls of the mesa structure can be passivated by either low-temperature oxidation of the exposed silicon, or by deposition of silicon oxide followed by densification and forming gas anneal. A collector contact 24 is formed on the surface of layer 12, with the contact 24 connected through a resistor 26 to a +V potential 28. A base contact 30 is provided in abutment with the base layers 16, 18 with the contact 30 connected to a signal source 32. An emitter contact 34 is provided on the surface of layer 22 and is grounded.

FIG. 3 illustrates the approximate band structure vertically through the device of FIG. 2 from emitter to collector, and FIGS. 4A and 4B illustrate the operating principle of the structure based on the band structure. The transistor is unipolar, doped n-type, except for the region 18 which is doped p-type. The p-type region 18 is narrow (approximately 50 Angstrom) so that sufficient band bending prevents a charge-neutral region of holes from occurring. However, the negative acceptor charge sets up a thermionic barrier, thereby preventing electron flow even when a positive bias is applied to the collector.

The negative charge region forms a potential well for holes, which are thermally generated or injected into the indicated inversion channel by the base diffusion of FIG. 2. This lateral transport of hole charge is similar to the operation of a MOSFET or MODFET. If the number of holes supplied to the channel approaches the surface charge density of the p-doped region, then the electric field lines terminating on the negative charge will originate primarily from the mobile holes, which results in a lowering of the thermionic barrier. Thus, collector current is controlled by the hole quasi-Fermi level of the base region, or equivalently, the concentration of holes in the inversion channel.

The hole and electron current densities are approximately given by the same expressions as for the BICFET device described by Taylor and Simmons, supra, as follows:

$$J_{pi} = qv_p P_o e^{-q/kT(-V_i + \Delta E_v/q)}(e^{qV/kT} - 1) \qquad (1)$$

$$J_{ni} = qv_n N_C e^{-q/kT(-V_i + \Phi_n/q)}(e^{qV/kT} - 1) \qquad (2)$$

where $v$ is the effective velocity of the holes or electrons, $P_o$ is the inversion hole charge density, $V_i^*$ is the barrier height, $\Phi_n$ is the metal to semi-insulating layer barrier height, and $\Delta E_v$ is the valence band discontinuity at the heterojunction.

Current limiting in this analysis due to space charge was ignored, due to the assumption of heavy doping of the thermionic barrier layer. Equations 1 and 2 yield a current gain of $$\beta = J_{ni}/J_{pi} \approx e^{(\Delta E_v - \Phi_n)/kT} \qquad (3)$$

For $\Delta E_v \approx 0.3 eV$, and $\Phi_n \approx 0$, current gains of $10^5$ should be possible. However, quantum mechanical corrections result in a lower value of predicted $\beta$ for the BICFET, and even lower values for the double heterojunction transistor, which uses a very thin region of narrow gap semiconductor (GeSi). However, the use of this narrow region of strained layer semiconductor is what allows implementation of the inversion base transistor in silicon.

This device is easily scaled down in size, since it does not have any voltage punchthrough limitations. It switches quickly, since it does not have minority charge storage problems as in the base region of a bipolar junction transistor. It has a low collector cut-in voltage and no minority charge injection into the collector during saturated operation due to the presence of a double heterojunction to confine the hole charge. Since the device has a very large current drive capability, the transistor excels at switching large capacitive loads quickly.

While the invention has been described with reference to a specific embodiment, the description is illustrative of the invention and is not to be construed as limiting the invention. For example, other heterostructure materials can be employed such as CuCl, ZnS, AlP and GaP, and other semiconductor material, layer thicknesses, dopant type and concentration levels can be used.

Thus, various modifications and applications may occur to those skilled in the art without departing from the true spirit and scope of the invention as defined by the appended claims.

What is claimed is:

1. A transistor structure comprising:
   a first region of a first semiconductor material having a first conductivity type, said first region having a major surface,
   a second region of a second semiconductor material positioned on said major surface of said first region and forming a first heterojunction with said first region,
   a third region of said first semiconductor material positioned on said second region, said third region having an opposite conductivity type relative to said first conductivity type, said third region forming a second heterojunction with said second region, and
   a fourth region of said first semiconductor material having said first conductivity type, said fourth region positioned on said third region.

2. The transistor structure as defined by claim 1 and further including a first contact to said first region, a second contact to said second and third regions, and a third contact to said fourth region, said contacts functioning as collector, base, and emitter contacts for a bipolar transistor.

3. The transistor structure as defined by claim 2 wherein said first region comprises a substrate and at least one epitaxial layer formed on said substrate and said second region comprises a semiconductor alloy.

4. The transistor structure as defined by claim 3 wherein said first semiconductor material is silicon and said semiconductor alloy comprises germanium-silicon.

5. The transistor structure as defined by claim 3 wherein said structure includes a mesa structure.

6. The transistor structure as defined by claim 5 wherein said substrate functions as a mechanical support for a plurality of said transistor structures.

7. The transistor structure as defined by claim 1 wherein said first region comprises a substrate and at least one epitaxial layer formed on said substrate and said second region comprises a semiconductor alloy.

8. The transistor structure as defined by claim 7 wherein said structure includes a mesa structure.

9. The transistor structure as defined by claim 8 wherein said substrate functions as a mechanical support for a plurality of said transistor structures.

10. The transistor structure as defined by claim 1 wherein said first region comprises an n-type silicon substrate and first and second n-type epitaxial layers on said substrate, said second region comprises a germanium-silicon alloy, said third region comprises a layer of p-type silicon, and said fourth region comprises two layers of n-type silicon.

11. The transistor structure as defined by claim 10 wherein one of said n-type epitaxial layers has a thickness on the order of 1.2 microns and a dopant concentration on the order of $2 \times 10^{19}$ atoms per cubic centimeter and the other epitaxial layer has a thickness on the order of 2600 Angstroms and a dopant concentration on the order of $1 \times 10^{17}$ atoms per cubic centimeter,
   said second region is a layer having a thickness on the order of 100 Å, said layer of p-type material has a thickness on the order of 50 Å and a dopant concentration on the order of $1 \times 10^{19}$ atoms per cubic centimeter, one of said two layers of said fourth region having a thickness on the order of 350 Å and a dopant concentration on the order of $1 \times 10^{18}$ atoms per cubic centimeter and the other of said layers having a thickness on the order of 800 Å and a dopant concentration on the order of $3 \times 10^{19}$ atoms per cubic centimeter.

* * * * *